United States Patent [19]

Douglas

[11] Patent Number: 5,545,290
[45] Date of Patent: * Aug. 13, 1996

[54] ETCHING METHOD

[75] Inventor: Monte A. Douglas, Coppell, Tex.

[73] Assignee: Texas Instruments Incorporated, Dallas, Tex.

[*] Notice: The portion of the term of this patent subsequent to Nov. 15, 2005, has been disclaimed.

[21] Appl. No.: 807,790

[22] Filed: Dec. 12, 1991

Related U.S. Application Data

[63] Continuation of Ser. No. 540,395, Jun. 19, 1990, abandoned, which is a continuation of Ser. No. 296,400, Jan. 9, 1989, abandoned, which is a continuation of Ser. No. 71,512, Jul. 9, 1987, abandoned.

[51] Int. Cl.$^6$ .................................................. H01L 21/00
[52] U.S. Cl. ........................... 156/646.1; 156/644.1; 156/662.1; 216/37; 216/58; 216/64
[58] Field of Search ................... 156/643.1, 646.1, 156/653.1, 657.1, 662.1, 644.1; 216/37, 58, 64

[56] References Cited

U.S. PATENT DOCUMENTS

| | | | |
|---|---|---|---|
| 4,104,086 | 8/1978 | Bondur et al. | 156/643 X |
| 4,252,579 | 2/1981 | Ho et al. | 156/643 X |
| 4,326,332 | 4/1982 | Kenney | 156/647 X |
| 4,468,285 | 8/1984 | Bayman et al. | 156/643 |
| 4,490,209 | 12/1984 | Hartman | 156/643 |
| 4,504,574 | 3/1985 | Meyer et al. | 156/628 X |
| 4,521,275 | 6/1985 | Purdes | 156/643 |
| 4,529,475 | 7/1985 | Okano et al. | 156/643 |
| 4,533,430 | 8/1985 | Bower | 156/643 |
| 4,580,331 | 4/1986 | Soclof | 156/643 X |
| 4,635,090 | 1/1987 | Tamaki et al. | 357/50 |
| 4,654,114 | 3/1987 | Kadomura | 156/643 |
| 4,659,426 | 4/1987 | Fuller et al. | 156/643 |
| 4,678,540 | 7/1987 | Uchimura | 156/643 |
| 4,683,486 | 7/1987 | Chatterjee | 357/23.6 |
| 4,741,799 | 5/1988 | Chen et al. | 156/646 X |
| 4,784,720 | 11/1988 | Douglas | 156/643 |
| 4,855,017 | 8/1989 | Douglas | 156/646 X |

FOREIGN PATENT DOCUMENTS

| | | | |
|---|---|---|---|
| 3508996 | 10/1985 | Germany. | |
| 53-145575 | 12/1978 | Japan | 156/643 |
| 53-146939 | 12/1978 | Japan | 156/643 |

(List continued on next page.)

OTHER PUBLICATIONS

Random House Dictionary of the English Language; The Unabridged Edition; 1967 Random House Inc.; p. 17.

*Primary Examiner*—Thi Dang
*Attorney, Agent, or Firm*—Ira S. Matsil; James C. Kesterson; Richard L. Donaldson

[57] ABSTRACT

The described embodiments of the present invention provide a trench etching technique having a high level of control over the sidewall profile of the trench and a high degree of selectivity to the etch mask. The described embodiments are for etching silicon and tungsten, but the invention is suitable for etching a wide variety of materials. A silicon etchant such as HBr, the combination of $HBr/SF_6$, $BCl_3$, $SICl_4$ or other etchant is combined with a passivant such as carbon monoxide or nitrogen. The passivant gases include an interactive $\pi$ bonding system and/or paired electrons not involved in bonding. These passivant gases create a weak adductive bond to the dangling bonds or radicals generated during etching. The passivant gases also create a weak adductive bond to the sides of the trench being etched and are not removed due to the oblique angle of the sidewalls relative to the reactive ion flux vector corresponding to the trench etch. In this manner, general and subtle profile control is achieved. The more complex molecules of the etch mask (using silicon dioxide or photoresist as used in the described embodiments) create more dangling bonds or surface radical states and bond tighter than silicon to the passivant gas. Thus, the selectivity to the mask material of the etch is enhanced.

8 Claims, 3 Drawing Sheets

FOREIGN PATENT DOCUMENTS

| | | | |
|---|---|---|---|
| 55-47381 | 4/1980 | Japan | 156/643 |
| 58-153334 | 9/1983 | Japan | 156/643 |
| 58-168235 | 10/1983 | Japan | 156/643 |
| 59-117258 | 7/1984 | Japan . | |
| 60-43829 | 3/1985 | Japan | 156/643 |
| 60-65533 | 4/1985 | Japan | 156/643 |
| 60-213053 | 10/1985 | Japan . | |
| 8004006 | 2/1982 | Netherlands | 156/643 |

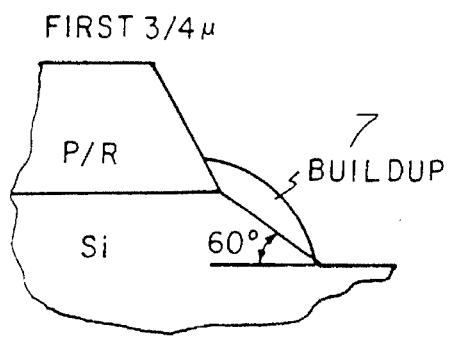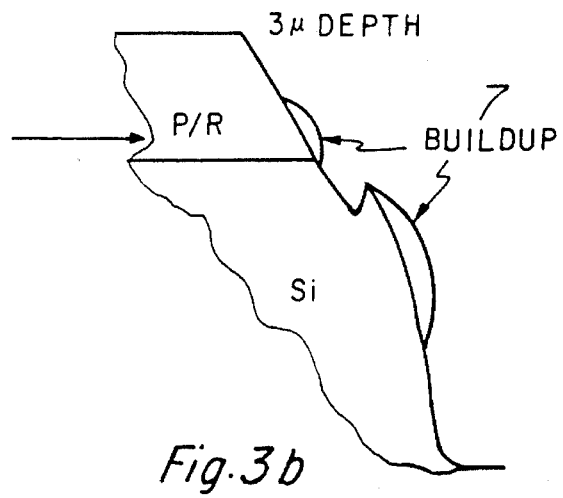
Fig. 3a  Fig. 3b
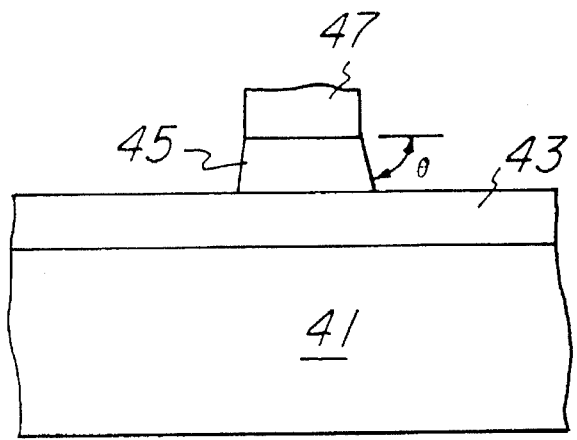
Fig. 4

20

ETCHING METHOD

This application is a continuation of application Ser. No. 07/540,395, filed Jun. 19, 1990, now abandoned, which is a continuation of Ser. No. 296,400, filed Jan. 9, 1989, now abandoned, which is a continuation of Ser. No. 071,512, filed Jul. 9, 1987, now abandoned.

FIELD OF THE INVENTION

The present invention relates to the field of chemical etching. More specifically, the present invention relates to the field of chemical etching in semiconductor substrates.

BACKGROUND OF THE INVENTION

The use of depressions into the surface of a semiconductor substrate to increase, for example, the capacitance of capacitor structures or the packing density of other circuit structures is quickly developing. For example, U.S. Pat. No. 4,651,184 issued Mar. 17, 1987 to Malhi shows an entire dynamic random access memory cell in a single high aspect ratio depression. Such depressions are commonly known as trenches.

Although the uses of trench techniques and the fabrication of integrated circuits are still being developed, some aspects of the trenches used which enhance the manufactureability and reliability of the integrated circuits using them are becoming clear. One aspect of great importance is that the trench profile must be carefully controlled, having positively sloping sidewalls, for example. In some prior art techniques, among other deleterious effects, negatively sloped sidewalls or bowing occurs, This leads to voids in the trench when refilled by subsequent fabrication processes and to shorts caused by polycrystalline silicon or metals filling the voids during subsequent manufacturing processes.

Another aspect is that the trenches should be capable of being etched as deeply as possible. Present techniques are limited by various problems in the process. For example, in copending application Ser. No. 730,701, now U.S. Pat. No. 4,702,795 issued Oct. 27, 1987, assigned to the present assignee, the depth of the trenches using the process described therein can be limited by several aspects: (1) Because the technique involves etching the mask to provide forward sputtering, the etch mask will at some point be entirely consumed and the etching must stop, (2) the forward sputtering process is not easily controlled and an overly positive slope of the trench sidewalls may result: the sloping sidewalls will at some point taper to a point where no more etching occurs, (3) the sidewall residue can accumulate to the point where the trench mouth is filled in, and (4) the sidewall angle of the mask materials influence the forward sputtering, and control of the mask sidewall is not easily achieved.

SUMMARY OF THE DETAILED DESCRIPTION

The described embodiments of the present invention provide a trench etching technique having a high level of control over the sidewall profile of the trench and a high degree of selectivity to the etch mask. The described embodiments are for etching silicon and tungsten, but the invention is suitable for etching a wide variety of materials. A silicon etchant such as HBr, the combination of $HBr/SF_6$, $BCl_3$, $SICl_4$ or other etchant is combined with a passivant such as carbon monoxide or nitrogen. The passivant gases include an interactive $\pi$ bonding system and/or paired electrons not involved in bonding. These passivant gases create a weak bond to the dangling bonds or radicals generated during etching of the mask. The passivant gases also create a weak bond to the sides of the trench being etched and are not removed due to the oblique angle of the sidewalls relative to the reactive ion flux vector corresponding to the trench etch. In this manner, general and subtle profile control is achieved. The more complex molecules of the etch mask (using silicon dioxide or photoresist as used in the described embodiments) create more dangling bonds or surface radical states and bond tighter than silicon to the passivant gas. Thus, the selectivity to the mask material of the etch is enhanced.

BRIEF DESCRIPTION OF THE DRAWINGS

FIGS. 3a and 3b are side view detailed drawings of the initial etching results when using an embodiment of the present invention and a photoresist etch mask:

FIG. 4 is a side view schematic diagram of the results from using one embodiment, of the present invention to etch a conductive layer such as a tungsten layer.

DETAILED DESCRIPTION

Figure 1:
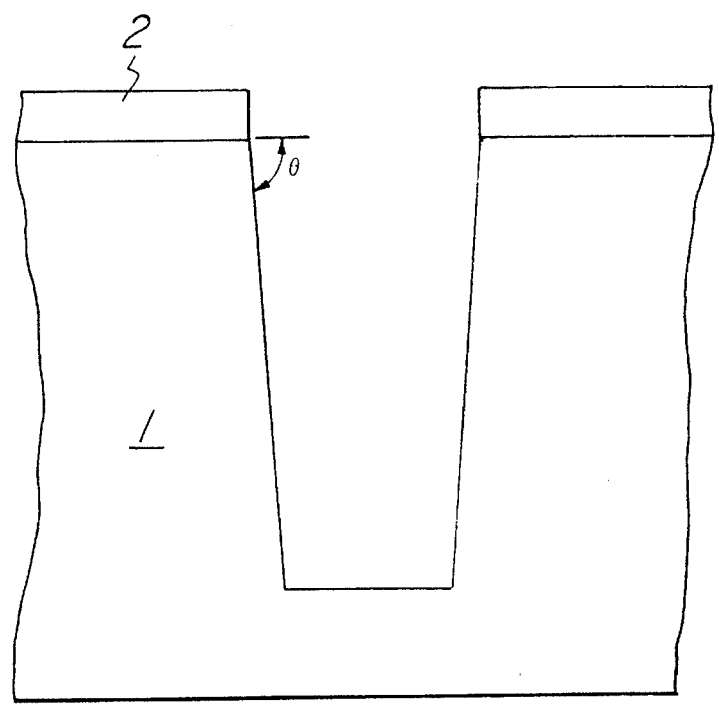
FIG. 1 is a side view schematic drawing showing a trench etch using one embodiment of the present invention and using a silicon dioxide hard mask.
Figure 2:
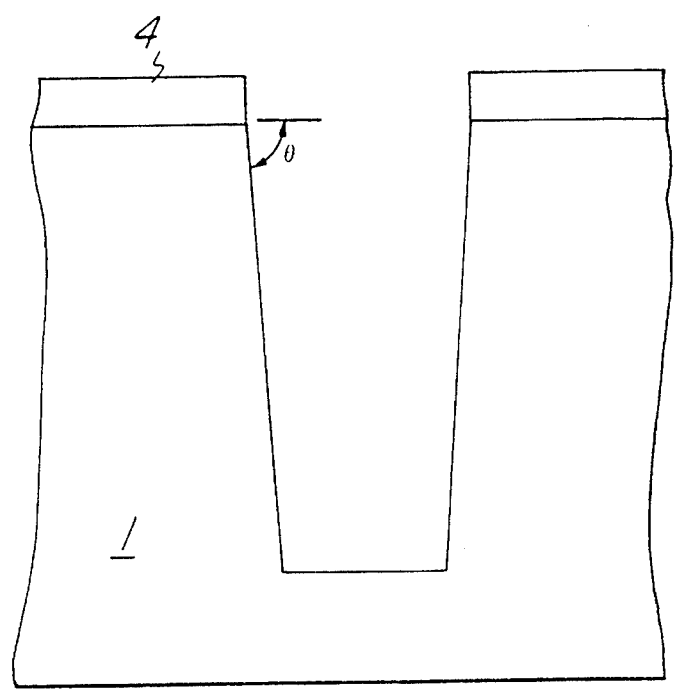
FIG. 2 is a side view schematic drawing showing a trench etch using another embodiment of the present invention and using a photoresist etch mask.

FIGS. 1 and 2 are side view schematic drawings showing the results of etching processes according to the present invention using a silicon dioxide hard mask and photoresist etch mask respectively. FIGS. 3a and 3b show detail of the initialization of trench etching when using a photoresist etch mask.

The starting point for the embodiment described with reference to FIG. 1 is a crystalline silicon substrate 1 covered by a silicon dioxide layer 2. Silicon dioxide layer 2 is formed by thermal oxidation or chemical vapor deposition on the surface of substrate 1. Silicon dioxide layer 2 is then masked and patterned using photolithographic techniques well known in the art. Patterned silicon dioxide layer 2 exposes opening 3 on the surface of substrate 1. The structure is then subjected to a reactive ion or plasma etching process. The substrate is placed in a chuck and is oppositely disposed from a shower head type gas diffuser. A combination of HBr with $SF_6$, $BCl_3$ or $SiCl_4$, for example, in combination with varying amounts of passivating gas, such as carbon monoxide, are then introduced into the plasma through the shower head and accelerated toward the substrate by an electric field established in the "dark space" between the plasma and the chuck or diffuse to the substrate, for uncharged species. The HBr-based chemistry etches the silicon substrate and partially etches silicon dioxide layer 2. As free surface radical states in the silicon and silicon dioxide are generated by the energy imparted from the ion stream, many of the dangling radical bonds are adductively bonded to the carbon monoxide molecules. Carbon monoxide forms a weak bond due to its low-lying, empty electron orbitals close to the ionization level. In those areas of substrate 1 where the incoming ions directly impinge the carbon monoxide which is adductively bonded, the carbon monoxide is displaced by the reactive ion and etching continues. However, on the sidewalls of the forming trench where the reactive ions do not impinge directly upon the carbon monoxide, a great deal of the carbon monoxide will remain adductively bonded, passivating the surface of the silicon substrate and preventing reaction between the silicon substrate and the halogen atoms generated from the HBr-based discharge. It has been experimentally determined that the greater amount of carbon monoxide admitted into the chamber, the more positively sloped (i.e. θ less than 90° relative to the surface of the substrate) the sidewalls of the trench are. It was also experimentally determined that, in the absence of carbon monoxide, the HBr etched a trench having negatively sloped sidewalls and thus retrograde bowing. Moreover, completely contrary to the established art, carbon monoxide is much more effective at higher pressure at eliminating bowing and producing positively sloped sidewalls. The established art teaches that higher pressures cause a greater lateral uncharged flux which causes greater undercut and retrograde bowing. Higher pressure provides a faster etching rate and thus higher material throughput. Thus, introduction of carbon monoxide into the etch caused the etching process to not only be completely anisotropic but provide a controllably positive slope crucial to the fabrication of state of the art circuits.

Several molecular species have appropriate molecular orbital structures to provide the required passivation effect. Among these are $H_2O$, $CO_2$, $NO_2$, NO, $N_2$, NOCl, COS, $CS_2$. The common feature among these chemicals is that their molecules contain an outer empty reactive electron orbital which is a low energy orbital or a weakly bonding pair of electrons in the outer orbital.

An even more dramatic effect of the passivation of carbon monoxide is shown with regard to FIG. 2. Photoresist layer 4 is formed on the surface of silicon substrate 1 and patterned using common photolithographic techniques. Using prior art techniques, the best selectivity possible in a reactive ion etching environment to photoresist when etching silicon is approximately three to one. Using the described embodiment, etching ratios in excess of 30 to 1 have been generated. Using a reactive ion etcher similar to the one described with regard to FIG. 1, the substrate held at 5° C., the shower head held at 25° C., reactive ion power of 500 Watts applied to the plates, a pressure of 300 millitorr, an HBr flow of 50 standard cubic centimeters per minute, an $SICl_4$ flow of 15 standard cubic centimeters per minute, the relationship between the selectivity to the photoresist and the sidewall slope versus the amount of carbon monoxide entered into the chamber is shown in Table I.

One phenomenon associated with the use of photoresist as an etch mask under certain conditions such as high process pressure or high CO flow, is an initial build up of forward sputtered mask material 7 and deposition of gas phase condensable species from CO and other plasma species as shown in FIG. 3a. During the first ¾ microns, a build-up as shown in FIG. 3a occurs causing very positive sidewall slopes. However, at approximately 3 microns of depth the reactive ion etching has broken down the build-up barrier and has caused a split build-up 9 as shown in FIG. 3b resulting in severe physical defects in the silicon sidewall. Thus, this phenomenon permits highly sloped profiles for shallow depths, which are attractive in certain applications; however, when etching deeper trenches, this effect must be avoided. But the degree of build up is easily controlled by altering the pressure or CO flow.

The dramatic increase in selectivity to photoresist caused by the inclusion of a carbon monoxide passivant is caused by adductive bonding to the dangling bonds or radicals ions generated in the photoresist. Because of the organic nature of the photoresist, breaking or cracking of the carbon chains occurs quite readily in the presence of a highly energetic ion bombardment such as that present in a reactive ion etcher. However, when these dangling bonds or cracking occurs, instead of combining with the etching material and being removed, the carbon monoxide combines with the dangling bonds to passivate them and prevent their reaction with the etchant. This phenomenon is unlike that shown in the prior art as shown in, for example, Meyer et al U.S. Pat. No. 4,504,574. The use of various chemicals to cause breaking of the carbon chains in the photoresist with subsequent recombination to create longer and/or more multiply linked and thus harder carbon chains is known in the art. It is often referred to as polymeric cross linking. The hardened mask described in Meyer et al requires subjection to carbon monoxide in the absence of etching compounds for 5 minutes to create cross linking. The embodiment here described prevents the etching of photoresist by passivating the surface rather than cross linking. As is clear from the disclosure of Meyer et al, the process there described requires a separate cross linking step and then etching rather than using in situ passivation as in the present embodiment.

The concept of passivating photoresist using adductive bonding can be applied when etching any material using a photoresist mask. For example, experiments were conducted using a photoresist mask over polycrystalline conductors and tungsten conductors. The results of these experiments using a carbon monoxide passivant are shown in FIG. 4. Using one embodiment of the invention, selectivity to photoresist when etching polycrystalline silicon and tungsten was 15:1 and 7:1, respectively, using $HBr/SiCl_4$ and $HBr/SF_6$, respectively, as etchants. Using these etchants in an unpassivated etching process provides selectivity ratios of 3:1 and less than 1:1, respectively. In addition, using the present invention, the undercut and/or the sidewall slope θ can be tightly controlled to provide any desired topology.

Figure 5:
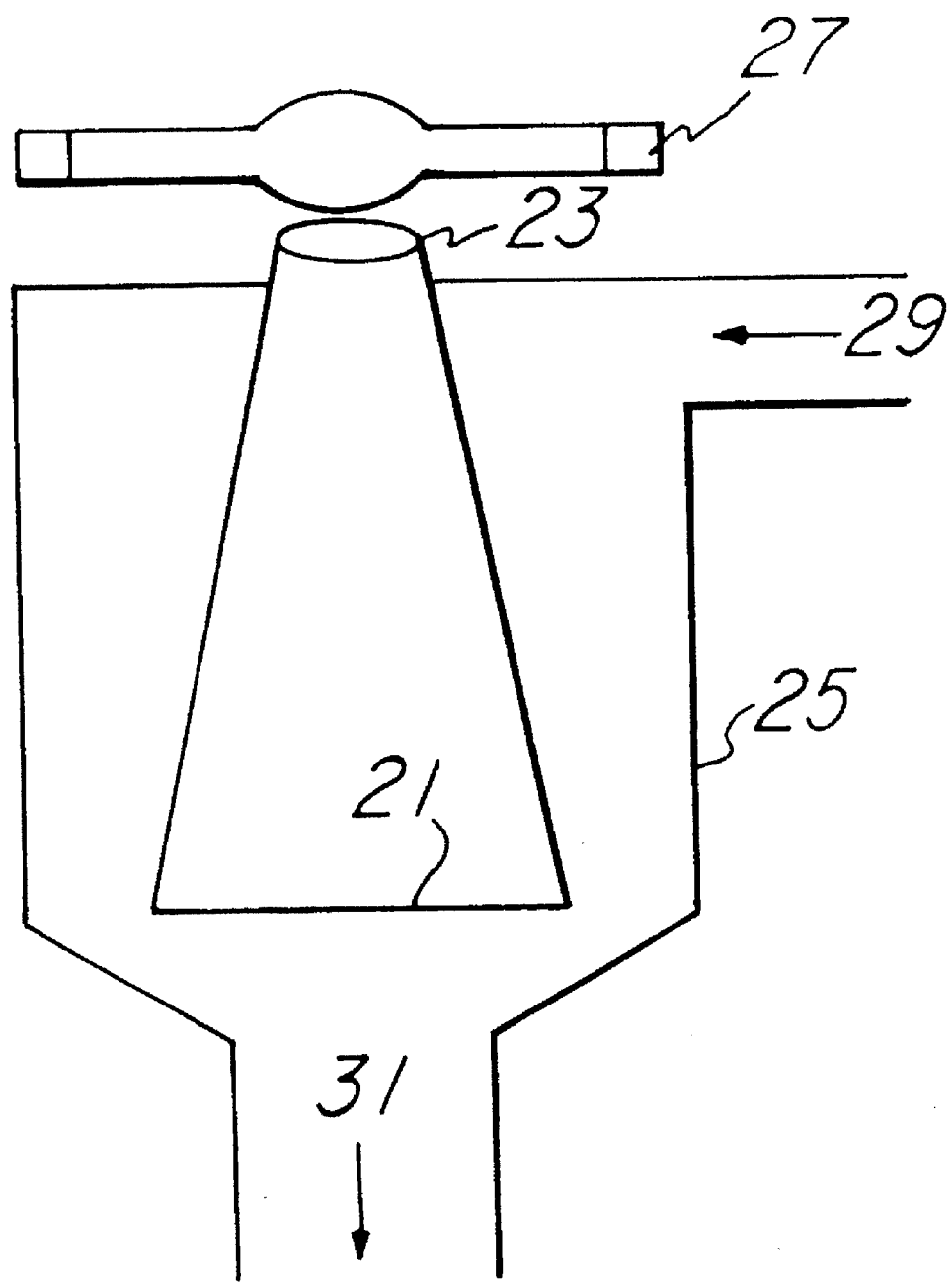
FIG. 5 is a schematic diagram representing a photochemical etching system illustrating another embodiment of the present invention.

FIG. 5 is a sideview schematic diagram depicting another embodiment of the present invention. Wafer 21 is placed in etching chamber 25. Ultraviolet source 27 is focused on wafer 21 by lens 23. An etching gas such as chlorine is pumped into etching chamber 25 via inlet 29 and is evacuated from etching chamber 25 via outlet 31. Chlorine atoms are disassociatively generated in the presence of the ultraviolet light which then combine with silicon of wafer 21 to form silicon chloride, gas which is evacuated through outlet 31. Unfortunately, lateral etching is as fast as vertical etching, resulting in severe undercut of the mask (not shown). However, when carbon monoxide is included in the incoming etchant gas, the carbon monoxide creates adductive bonding on the mask (not shown) and on the side walls of the material being etched (not shown) using this process. This improves etchant selectivity to the mask. The adductive bonds are continually formed and then are destroyed by the ultraviolet light by photo-induced desorption on the surface normal to the light in a similar manner to that described above in reactive ion etching and plasma etching thus etching is not; appreciably affected in the direction of the light. The waste carbon monoxide gas is evacuated through outlet 31. This process provides the profile control and selectivity enhancement advantages discussed above. Moreover, generation of sidewall passivating species does not involve typical energetic dissociative processes which is critical to an "energy lean" ambient associated with photochemical processing.

Although the described embodiments show the invention used in conjunction with specific materials, no such limitation to the present invention should be inferred. The present invention is not limited to silicon or crystalline material and is only limited by the claims appended hereto.

TECHNICAL ADVANTAGES

The described embodiments of the present invention provide an etching process using a passivating material in situ with the etchant process itself. The present invention provides excellent profile control and improved selectivity to photoresist and other masking materials.

TABLE I

| CO Flow | Si: Photo Resist Etch Rate Ratio | Trench Profile Slope |
|---|---|---|
| 0 | 3:1 | negative; retrograde bowing |
| 30 | 12:1 | positive slope; 87° |
| 50 | 13:1 | positive slope; 80° |

I claim:

1. A method of etching comprising:

forming an etch mask on a surface of a crystalline substrate;

introducing an etchant and a passivating material to said substrate to etch a sidewall into said substrate wherein said etchant comprises a mixture of HBr and $SiCl_4$; and adductively bonding a monolayer of said passivating material to said sidewall, wherein the amount of said passivating material introduced is selected to control the slope of said sidewall wherein said passivating material is selected from the group consisting of CO, $H_2O$, $NO_2$, NOCl, COS, $CS_2$ and combinations thereof.

2. The method of claim 1 wherein said crystalline substrate comprises silicon.

3. The method of claim 1 wherein said etch mask comprises silicon dioxide.

4. The method of claim 1 wherein said etch mask comprises photoresist.

5. A method of etching silicon-containing compounds, comprising the steps of:

providing a silicon-containing body;

providing a mask on a surface of said body;

providing a silicon etchant over said mask and surface, said etchant comprising a mixture of HBr and $SiCl_4$; and providing a silicon dangling-bond passivant, said passivant characterized by molecules that weakly bond to silicon dangling bonds and said passivant is selected from the group consisting of CO, $H_2O$, $NO_2$, NOCl, COS, $CS_2$ and combinations thereof.

6. The method of claim 5, further comprising the step of:

exciting said etchant into a plasma.

7. The method of claim 5 wherein said etch mask comprises silicon dioxide.

8. The method of claim 5 wherein said etch mask comprises photoresist.

* * * * *